United States Patent
Matsuura et al.

(10) Patent No.: US 10,148,296 B2
(45) Date of Patent: Dec. 4, 2018

(54) TRANSMITTER, COMMUNICATION UNIT AND METHODS FOR LIMITING SPECTRAL RE-GROWTH

(71) Applicant: MediaTek, Inc., Hsin-Chu (TW)

(72) Inventors: Toru Matsuura, Cupertino, CA (US); Paul Cheng Po Liang, Hsinchu County (TW)

(73) Assignee: MediaTek, Inc., Hsin-Chu (TW)

( * ) Notice: Subject to any disclaimer, the term of this patent is extended or adjusted under 35 U.S.C. 154(b) by 0 days.

(21) Appl. No.: 15/662,848

(22) Filed: Jul. 28, 2017

(65) Prior Publication Data

US 2018/0159567 A1  Jun. 7, 2018

Related U.S. Application Data

(60) Provisional application No. 62/429,156, filed on Dec. 2, 2016.

(51) Int. Cl.

| H04B 1/62 | (2006.01) |
|---|---|
| H04B 1/04 | (2006.01) |
| H04L 27/36 | (2006.01) |
| H04L 25/03 | (2006.01) |
| H03F 3/24 | (2006.01) |
| H03F 1/32 | (2006.01) |
| H04B 1/00 | (2006.01) |

(52) U.S. Cl.
CPC ......... *H04B 1/0475* (2013.01); *H03F 1/3247* (2013.01); *H03F 3/24* (2013.01); *H04B 1/006* (2013.01); *H04L 25/03343* (2013.01); *H04L 27/368* (2013.01); *H03F 2200/129* (2013.01); *H03F 2200/411* (2013.01); *H04B 2001/0425* (2013.01); *H04B 2001/0433* (2013.01)

(58) Field of Classification Search
CPC .................. H04B 1/0475; H04B 1/006; H04B 2001/0425; H04B 2001/0433; H04L 25/03343; H04L 27/368; H03F 1/3247; H03F 3/24; H03F 2200/129; H03F 2200/411
USPC ........................................ 375/295, 296, 297
See application file for complete search history.

(56) References Cited

U.S. PATENT DOCUMENTS

| 8,000,661 | B2 * | 8/2011 | Chiu ..................... H03F 1/3247 455/114.3 |
|---|---|---|---|
| 2004/0121741 | A1 * | 6/2004 | Rashev ................. H03F 1/3211 455/114.3 |
| 2011/0170630 | A1 * | 7/2011 | Silverman ......... H04L 25/03343 375/296 |
| 2013/0222059 | A1 * | 8/2013 | Kilambi ............... H04B 1/0475 330/149 |
| 2013/0271212 | A1 * | 10/2013 | Bai ....................... H03F 1/3247 330/149 |
| 2014/0191798 | A1 * | 7/2014 | Lozhkin ............... H03F 1/3247 330/149 |

(Continued)

*Primary Examiner* — Siu Lee
(74) *Attorney, Agent, or Firm* — Optimus Patents US, LLC

(57) ABSTRACT

A transmitter includes a signal generator arranged to generate a digital baseband signal representative of a signal for transmission; a digital predistortion, DPD, circuit configured to predistort the digital baseband signal; and a signal adjustment circuit operably coupled to the signal generator and the DPD circuit and configured to receive the generated signal and apply shaping to adjust the predistortion applied to the envelope of the generated signal.

20 Claims, 9 Drawing Sheets

(56) References Cited

U.S. PATENT DOCUMENTS

| | | | |
|---|---|---|---|
| 2014/0247906 A1* | 9/2014 | Pang | H03F 1/3247 |
| | | | 375/297 |
| 2014/0269990 A1* | 9/2014 | Chen | H04L 27/367 |
| | | | 375/297 |
| 2014/0294119 A1* | 10/2014 | Sochacki | H04B 1/62 |
| | | | 375/296 |
| 2015/0078484 A1* | 3/2015 | Xiao | H03F 1/3247 |
| | | | 375/297 |
| 2016/0241277 A1* | 8/2016 | Rexberg | H04B 1/0475 |
| 2017/0012585 A1* | 1/2017 | Sarbishaei | H03F 1/0222 |

* cited by examiner

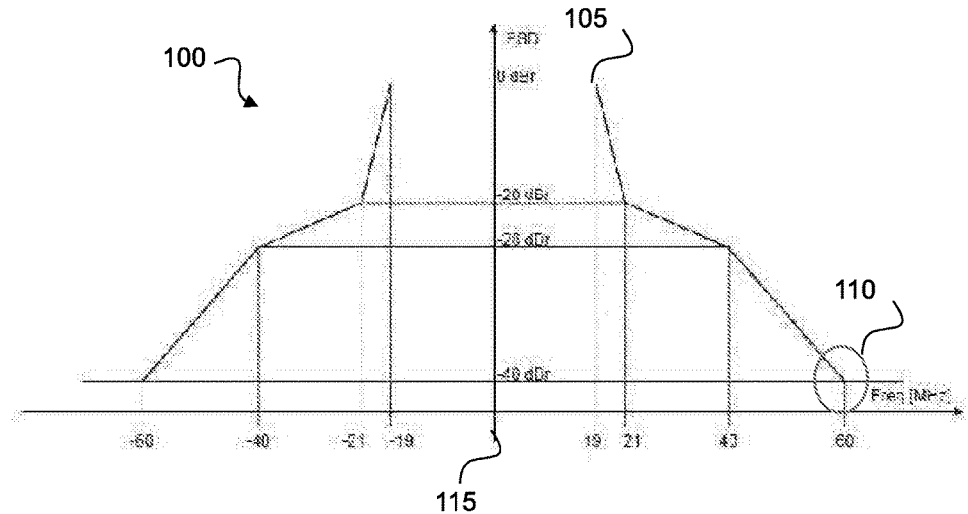
FIG. 1 - Prior Art
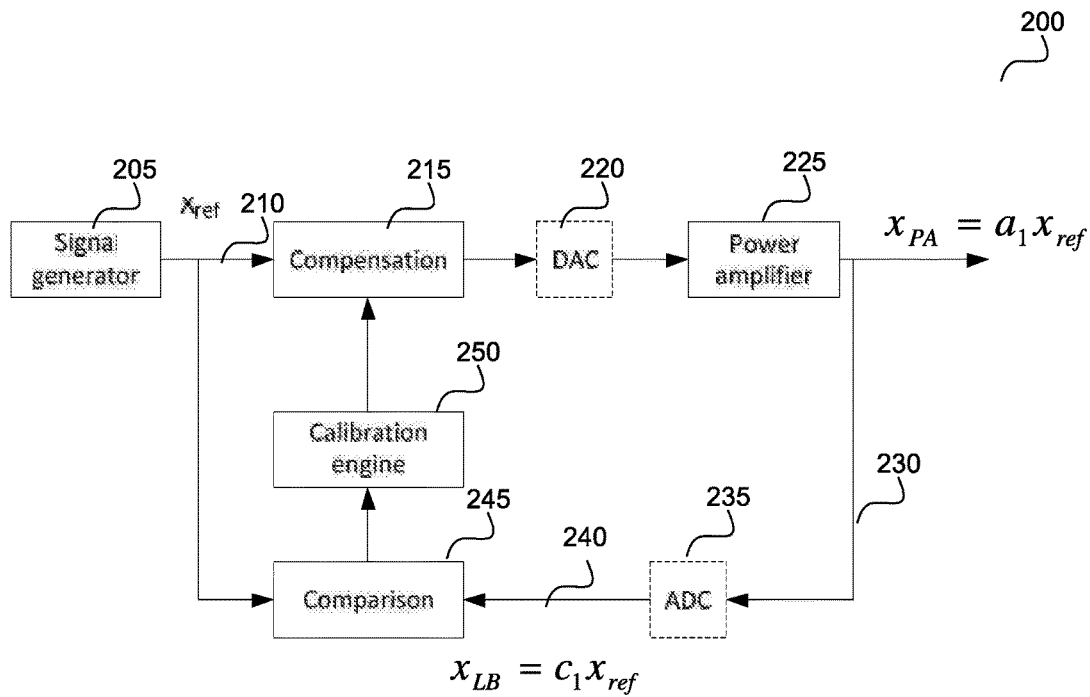
FIG. 2 - Prior Art

TRANSMITTER, COMMUNICATION UNIT AND METHODS FOR LIMITING SPECTRAL RE-GROWTH

FIELD OF THE INVENTION

The field of this invention relates to a transmitter, a communication unit and methods for controlling or limiting spectral re-growth, and in particular to methods and apparatus for controlling or limiting spectral re-growth within a transmitter in a wireless communication unit.

BACKGROUND OF THE INVENTION

A primary focus and application of the present invention is the field of transmitters and radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum possible power, leading to poor efficiency of the power amplifier. Specifically, in this field, there has been a significant amount of research effort in developing high-power efficient topologies capable of providing useful performance in the 'back-off' (linear) region of the power amplifier.

Linear modulation schemes require linear amplification of the modulated signal in order to minimise undesired out-of-band emissions from spectral re-growth. However, the active devices used within a typical RF power amplifier are inherently non-linear by nature. Only when a small portion of the consumed direct current (DC) power is transformed into RF power, can the transfer function of the amplifying device be approximated by a straight line, i.e. as in an ideal linear amplifier. This mode of operation provides a low efficiency of DC to RF power conversion.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, such as Cartesian Feedback, Feed-forward, and Adaptive Digital Pre-distortion (DPD), which are often used when designing linear transmitters.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues, for various communications standards, a number of techniques have been proposed.

Referring to FIG. 1, a known output power spectrum mask 100 of WiFi™ enabled devices, showing the output power limits vs bandwidth from the carrier frequency 115 of a WiFi™ transmission, is illustrated. As illustrated, in WiFi™ enabled devices, the output power spectrum 100 requirement limits the output power 105. Linearization techniques, for example using pre-distortion, that may be employed to linearise the transmit signal, are unable to prevent spectral regrowth 110 at low output power levels distal from the carrier frequency 115. Thus, mechanisms to better control spectral regrowth are desired.

FIG. 2 illustrates a block diagram 200 of a known transmitter architecture that uses a digital pre-distortion (DPD) technique. Here, a signal generator 205 generates a DPD digital training signal ($X_{ref}$) 210 that is routed through the transmitter circuit, converted to analog form in a digital-to-analog converter (DAC) 220 and particularly routed through a power amplifier 225, such that the output signal ($X_{PA}$) 230 is an amplified analog representation of the DPD digital training signal ($X_{ref}$) 210. A portion of the output signal ($X_{PA}$) 230 is routed back to the DPD circuit and converted back to digital form 240 in analog-to-digital converter (ADC) 235, and subsequently compared to the DPD digital training signal ($X_{ref}$) 210 in a comparison circuit 245. A calibration circuit (engine) 250 determines how the transmitter circuitry, and particularly the power amplifier 225, has affected the DPD digital training signal ($X_{ref}$) 210 by analyzing the output from the comparison circuit 245 and determining PA nonlinearity (amplitude modulated to amplitude modulated (AM-to-AM) and amplitude modulated to phase modulated (AM-to-PM)) effects. The calibration circuit (engine) 250 then adapts phase and gain components in the DPD compensation circuit 215 that, effectively, pre-distorts the input signal, e.g. DPD digital training signal ($X_{ref}$) 210, to compensate for the subsequent non-linearity and distortion effects that will be caused to the input signal by the transmitter circuit. In this manner, a linear transmitter signal is output from the power amplifier, with the inherent non-linearity effects that would have been created cancelled out by the DPD applied by the compensation circuit 215.

In order to meet output power spectrum requirement limits, such as those illustrated in FIG. 1, known transmitters selectively enable or disable DPD compensation circuits, for example based on measurement results of the output power spectrum, typically via an output power spectrum density (PSD) measurement of the PA fed back signal. Alternatively, in order to meet output power spectrum requirement limits, such as those illustrated in FIG. 1, known transmitters may just attenuate the whole output signal to reduce the output power across the whole bandwidth of operation in order to meet the spectrum mask.

U.S. Pat. No. 8,446,979 (2013, PMC-Sierra) describes a technique of envelope sharing whereby coefficients of a DPD are adapted to provide a soft-clip type of filter response characteristic versus a hard-clip type filter response characteristic to reduce the Peak-to-Average Power Ratio PAPR of the modulation signal. However, such a technique is best suited to the higher modulation coding scheme versions of communication standards. The book titled 'RF Power Amplifiers for Wireless Communications' and authored by Steve. C. Cripps, also describes a mechanism to compensate for predistortion as an input signal is sampled.

Thus, there exists a need for a more efficient and cost effective solution to reduce spectral re-growth control in transmitters, particularly for transmitters that employ linearization techniques such as DPD.

SUMMARY OF THE INVENTION

Accordingly, the invention seeks to mitigate, alleviate or eliminate one or more of the above mentioned disadvantages singly or in any combination.

According to a first aspect of the invention, there is provided a transmitter that includes a signal generator arranged to generate a digital baseband signal representative of a signal for transmission; a digital predistortion, DPD, circuit configured to predistort the digital baseband signal; a power amplifier arranged to amplify the predistorted signal; and a signal adjustment circuit operably coupled to the signal generator and the DPD circuit and configured to receive the generated signal and apply polynomial shaping to adjust the predistortion applied to at least an amplitude of the generated signal.

In this manner, a transmitter architecture is described, for example one that uses a DPD circuit, which is able to control spectral regrowth of a transmitted modulated signal based on polynomial shaping applied to the signal to be transmitted. In some examples, the polynomial shaping may be applied through control or adjustment of the DPD values applied to the signal to be transmitted within the DPD circuit.

In an optional example embodiment, the transmitter includes a processor coupled to the signal adjustment circuit and configured to determine polynomial shaping ($f_{TX}(x)$) to be applied wherein the signal adjustment circuit applies polynomial shaping to the DPD circuit to predistort the amplitude of the generated signal in a calibration process. In this optional calibration example embodiment, the polynomial shaping ($f_{TX}(x)$) applied by the signal adjustment circuit is a function of |x| and corresponds to envelope control of the signal for transmission. In this optional calibration example embodiment, the polynomial shaping may be inverse polynomial shaping applied to a power amplified signal in a feedback path from the power amplifier. In some examples, applying an inverse polynomial comprises applying multiplication substantially of a form of: $1/(1-a|x|^2)$, or in some examples of a form of: $1/(1-a3*|x|^2-a5*|x|^4- \ldots )$. In this optional calibration example embodiment, an input digital signal to the DPD circuit in a calibration process may be an input digital linearization training signal. In this optional calibration example embodiment, the determined polynomial shaping may include DPD values that are stored by the signal adjustment circuit.

In an optional example embodiment, the polynomial shaping is determined and applied to the DPD circuit to predistort an envelope of the generated signal in a compensation process. In an optional example embodiment, the polynomial shaping is applied to a portion of an input digital signal that is also provided to the DPD circuit, wherein the polynomial shaping of the input digital signal is used to adjust the predistortion applied to the envelope of the generated input digital signal. In some examples, a polynomial shaped version of the input digital signal is compared with a power amplified signal in a feedback path from the power amplifier and the comparison thereof is used to adjust the predistortion applied to the envelope of the generated input digital signal. In some examples, applying a polynomial shaping comprises applying multiplication substantially of a general order form of: $f_{TX}(x)=1-a3*|x|^2-a5*|x|^4- \ldots$ or in some examples a $3^{rd}$ order form of: $f_{TX}(x)=1-a*|x|^2$. In some examples, the polynomial shaping determined and applied to the DPD circuit comprises applying a first polynomial shaping to the input digital signal in the DPD compensation path, applying the polynomial shaped input digital signal to a DPD gain circuit to amplify the polynomial shaped input digital signal and applying the amplified polynomial shaped input digital signal to a second polynomial shaping circuit. In some examples, a DPD gain circuit is configured to provide a DPD component adjustment input signal to the DPD circuit that encompasses the first polynomial shaping, the DPD gain circuit and the second polynomial shaping circuit.

In some examples, the signal adjustment circuit may be further configured to apply only amplitude modulation, AM, control with polynomial shaping to the generated signal in addition to the DPD circuit being configured to applying AM control and phase modulation, PM, control. In some examples, a look-up table, LUT, coupled to the DPD circuit comprises DPD data that is adapted to account for PM effects due to the signal adjustment circuit applying amplitude modulation, AM, control of the generated signal with polynomial shaping.

According to a second aspect of the invention, there is provided a communication unit having a transmitter that includes a signal generator arranged to generate a digital baseband signal representative of an envelope signal for transmission; a digital predistortion, DPD, circuit configured to predistort the digital baseband signal; a power amplifier arranged to amplify the predistorted signal; and a signal adjustment circuit operably coupled to the signal generator and the DPD circuit and configured to receive the generated signal and apply polynomial shaping to adjust the predistortion applied to at least an amplitude of the generated signal.

According to a third aspect of the invention, there is provided a method for limiting spectral re-growth within a transmitter, the method comprising: generating a digital baseband signal representative of a signal for transmission; applying polynomial shaping to the digital signal representative of a signal for transmission or an amplified version of the predistorted signal; predistorting the digital baseband signal by a digital predistortion, DPD, circuit; amplifying the predistorted signal; and adjusting the DPD circuit based on polynomial shaping, such that predistortion applied to at least an amplitude of a generated signal controls spectral re-growth.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs are illustrated for simplicity and clarity and have not necessarily been drawn to scale.

FIG. 1 illustrates a known output power spectrum showing the power limits vs frequency of a WiFi™ transmission.

FIG. 2 illustrates a block diagram of a known transmitter architecture that uses a digital pre-distortion (DPD) technique.

DETAILED DESCRIPTION

Examples of the invention will be described in terms of polynomial shaping of signals for use in a wireless communication unit, such as an user equipment (UE) in Long Term Evolved (LTE™) parlance that is WiFi™-enabled. However, it is envisaged that the polynomial shaping of signals of concepts herein described may be applicable in any situation where by control of spectral regrowth is desired. In the context of the examples of the invention, the term polynomial shaping of signals encompasses applying an inverse of the polynomial shaping of a signal. Examples of the invention will also be described in terms of third-order polynomial shaping of signals. However, it is envisaged that other order polynomial shaping of signals may benefit from the concepts herein described. Examples of the invention will also be described in terms of polynomial shaping of signals as applied to a linearization technique, such as digital pre-distortion, so that the polynomial shaping of signals can be applied as a part of the DPD operation. However, it is envisaged that the polynomial shaping of signals may be applied to other linearization techniques, or any system that employs a digital adjustment of a signal to be transmitted. Examples of the invention will also be described in terms of polynomial shaping of a signal envelope in one or both of two paths: a calibration path (such as a DPD calibration path), a compensation path (such as a DPD compensation path).

The DPD calibration is performed for DPD training and in some examples it may be initiated either in a factory set-up, or following power-on of a terminal, or in response to a temperature change, whereby a training signal is used to determine the appropriate transmitter linearization values to use. In the DPD compensation phase, the transmitter output the modulation signal to a receiver and the modulation signal can be compensated by DPD or polynomial shaping control.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 3:
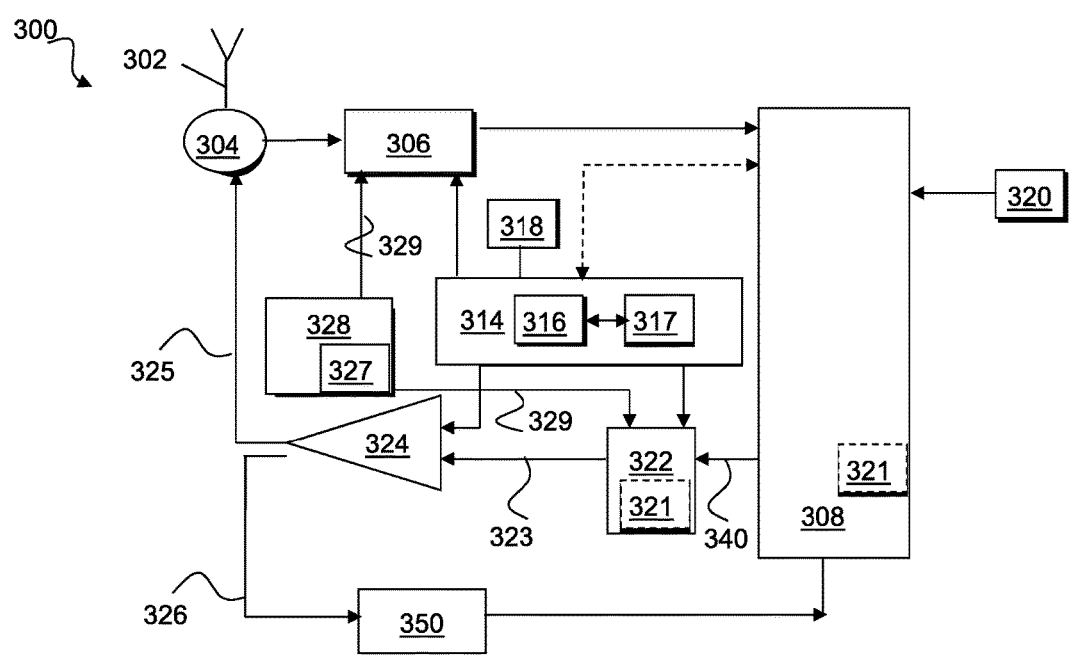
FIG. 3 illustrates a simplified block diagram of an example of a communication unit in accordance with some examples of the invention.

Referring now to FIG. 3, a block diagram of a wireless communication unit 300, adapted in accordance with some example embodiments of the invention, is shown. In practice, purely for the purposes of explaining embodiments of the invention, the wireless communication unit is described in terms of a wireless subscriber communication unit, which in some examples may be a smartphone supporting WiFi™ communications. The wireless communication unit 300 contains an antenna arrangement 302, for radiating signals and/or for receiving transmissions, coupled to an antenna switch 304 that provides isolation between receive and transmit chains within the wireless communication unit 300. One or more receiver chains, as known in the art, include(s) receiver front-end circuitry 306 (effectively providing reception, filtering and intermediate or base-band frequency conversion). The receiver front-end circuitry 306 is coupled to a signal processing module 308 (generally realized by a Digital Signal Processor (DSP)). A skilled artisan will appreciate that the level of integration of receiver circuits or components may be, in some instances, implementation-dependent.

A controller 314 maintains overall operational control of the wireless communication unit 300. The controller 314 is coupled to the receiver front-end circuitry 306 and the signal processing module 308. In some examples, the controller 314 is also coupled to a buffer module 317 and a memory device 316 that selectively stores data relating to operating functions, such as information relating to DPD gains, look-up-table information (say for a DPD), polynomial shaping algorithms and/or functions, inverse polynomial shaping algorithms and/or functions, and the like. A timer 318 is operably coupled to the controller 314 to control the timing of operations (e.g. transmission or reception of time-dependent signals) within the wireless communication unit 300.

The transmit chain includes transmitter/modulation circuitry 322 and a power amplifier 324 coupled to the antenna arrangement 302, which may comprise for example an antenna array, or plurality of antennas. The transmitter/modulation circuitry 322 and the power amplifier 324 are operationally responsive to the controller 314. In some examples, the signal processing module 308 and/or controller 314 may receive inputs from one or more input device or sensor modules 320. Frequency generation circuit 328 includes at least one local oscillator, LO, 327 and is operably coupled to the receiver front-end circuitry 306 and the transmitter/modulation circuitry 322 and arranged to provide local oscillator signals 329 thereto.

In example embodiments, the transmit chain includes a digital signal adjustment circuit 321, which may be located in transmitter/modulation circuitry 322 or within the signal processor 308, or any other suitable circuit, as shown. In some examples herein described, the digital signal adjustment circuit 321 may encompass DPD functionality with a DPD look-up-table (LUT), as described in later figures. In example embodiments, signal processor 308 generates a digital signal, such as a DPD digital training signal that is routed through the transmitter/modulation circuitry 322, converted to analog form in a DAC, typically located in transmitter/modulation circuitry 322 and routed through a power amplifier 324, such that the output signal 325 is an amplified analog representation of the DPD digital training signal. A portion 326 of the output signal 325 is converted back to digital form in down-converter and analog-to-digital converter (ADC) 350 and routed back to the digital signal adjustment circuit 321. The digital signal adjustment circuit 321 is configured to apply polynomial shaping to an input signal envelope in accordance with any one or more of the examples herein described with reference to FIGS. 4 to 9.

Clearly, a number of the various components within the wireless communication unit 300 can be realized in discrete or integrated component form, with an ultimate structure therefore being application-specific or design-based.

Figure 4:
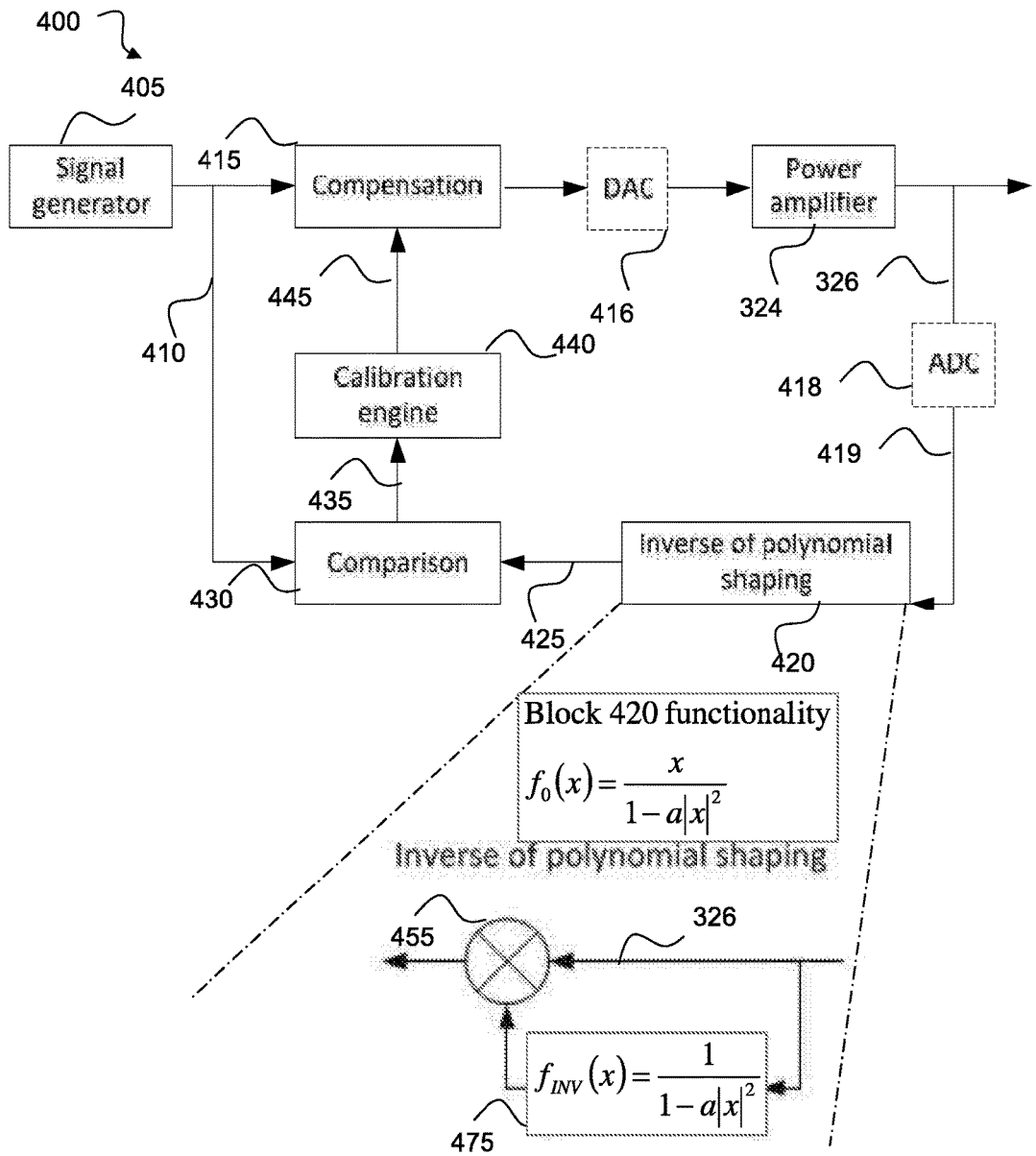
FIG. 4 illustrates a first example block diagram of an envelope shaping by digital pre-distortion (DPD) calibration arrangement in accordance with some examples of the invention.

FIG. 4 illustrates a first example block diagram of an envelope shaping by digital pre-distortion (DPD) calibration arrangement in accordance with some examples of the invention. The example illustrated in FIG. 4 applies to a $3^{rd}$ order polynomial shaping function, although in other examples it is envisaged that the shaping function can be applied to any other order of polynomial. In this example, a signal generator 405 generates a DPD digital training signal ($X_{ref}$) 410 that is routed through the transmitter circuit, converted to analog form in an optional digital-to-analog converter (DAC) 416 and particularly routed through a power amplifier 324, such that the output signal ($Y_{PA}$) 326 is an amplified analog representation of the DPD digital training signal ($X_{ref}$) 410. A portion of the output signal ($Y_{PA}$) 326 is routed back to the DPD circuit, down-converted (not shown) to baseband signal ($X_{PA}$) and converted back to digital form 419 in analog-to-digital converter (ADC) 418. In accordance with the first example of envelope shaping a signal by DPD calibration, the down-converted baseband portion of the output signal ($X_{PA}$) 326 is input to an inverse shaping processing circuit 420 that performs an inverse of the shaping operation on the down-converted baseband portion of the output signal ($X_{PA}$) 326. An inverse shaped representation of the DPD digital training signal 425 is output from the inverse shaping processing circuit 420 and is subsequently compared to the DPD digital training signal ($X_{ref}$) 410 in a comparison circuit 430.

A calibration circuit (e.g. calibration processing engine) 440 determines how the transmitter circuitry, and particularly the power amplifier 324, has affected the DPD digital training signal ($X_{ref}$) 410, including the influence of the inverse polynomial shaping, by analyzing the output from the comparison circuit 435 and determining PA nonlinearity (amplitude modulated to amplitude modulated (AM-to-AM) and amplitude modulated to phase modulated (AM-to-PM)) effects. The calibration circuit 440 then adapts phase and gain components in the DPD compensation circuit 415 that, effectively, pre-distorts the input signal, e.g. DPD digital training signal ($X_{ref}$) 410, to compensate for the subsequent non-linearity and distortion effects that will be caused to the input signal by the transmitter circuit and shape the envelope at same time. In this manner, a desired envelope shaped transmitter signal is output from the power amplifier, with the inherent non-linearity effects that would have been created cancelled out by the DPD applied by the compensation circuit 415.

In this example, where $f_{TX}(x)=1-a*|x|^2$, the polynomial shaping processing circuit 420 is configured to apply $3^{rd}$ order inverse polynomial shaping in a DPD calibration process, which is particularly useful for controlling the spectral regrowth of the transmit signal and reduce higher order nonlinearity to meet a WiFi™ spectral mask. In this example, the polynomial shaping processing circuit 420 includes a processor 475 configured to apply the $3^{rd}$ order inverse polynomial shaping function in equation [1] to the down-converted baseband portion of the output signal ($X_{PA}$) 326, which is then multiplied to the down-converted baseband portion of the output signal ($X_{PA}$) 326 in multiplier 455.

$$f_{TX}(x) = 1 - a|x|^2 \quad [1]$$

$$f_{INV}(x) = \frac{1}{f_{TX}(x)} = \frac{1}{1 - a|x|^2}$$

where $a$ is positive constant and $f_{TX}(x)$ is a desired shape

In other examples, the concept may be applied to any other transmitter architecture, where spectral regrowth is a concern, and is not limited to DPD calibration/compensation in order to support any shaping, including polynomial shaping. The relationship between shaping and inverse shaping is illustrated in equation [1].

It is envisaged that in other examples that the shaping function can be applied to any higher order of polynomial shaping function, as illustrated in equation [2].

$$f_{TX}(x) = 1 - \sum_n a_n |x|^{n-1} \quad [2]$$

$$f_{INV}(x) = \frac{1}{f_{TX}(x)} = \frac{1}{1 - \sum_n a_n |x|^{n-1}}$$

where $a_n$ is constant.

For example, a non-polynomial implementation that may avoid unnecessary distortion at low output power and saturation region of PA may apply one of the following shaping functions:

$$f_{TX}(x) = 1 \quad \text{if } x < x_0 \quad [3]$$

$$f_{TX}(x) = 1 - a_3 |x|^2 \quad \text{if } x_0 \leq x < x_1 \quad [4]$$

$$f_{TX}(x) = \frac{x_1}{|x|} \quad \text{if } x \geq x_1 \quad [5]$$

Figure 5:
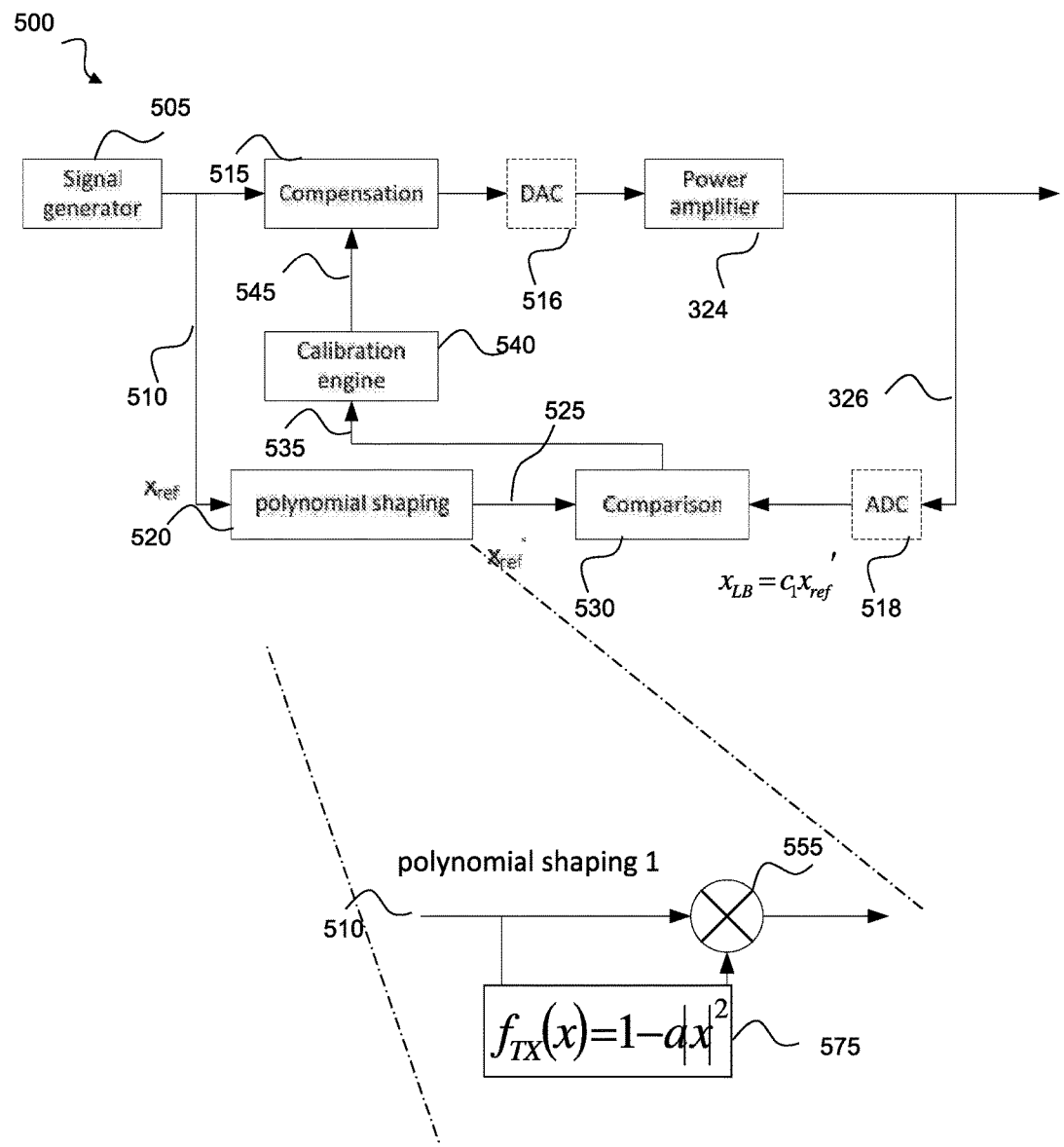
FIG. 5 illustrates a second example block diagram of an envelope shaping by digital pre-distortion (DPD) calibration arrangement in accordance with some examples of the invention.

Referring now to FIG. 5, a second example block diagram 500 of an envelope shaping by digital pre-distortion (DPD) calibration arrangement is illustrated, in accordance with some examples of the invention. The example illustrated in FIG. 5 applies to a $3^{rd}$ order polynomial shaping function, although in other examples it is envisaged that the shaping function can be applied to any other order of polynomial. In this example, a signal generator 505 generates a DPD digital training signal ($X_{ref}$) 510 that is routed through the transmitter circuit, converted to analog form in an optional digital-to-analog converter (DAC) 516 and particularly routed through a power amplifier 324, such that the output signal ($Y_{PA}$) 326 is an amplified analog representation of the DPD digital training signal ($X_{ref}$) 510. In these examples, we define $Y_{PA}$ as the RF signal part and $X_{PA}$ as the baseband signal part. A portion of the output signal ($Y_{PA}$) 326 is routed back to the DPD circuit, down-converted (not shown) to the baseband signal ($X_{PA}$) and converted back to digital form 519 in analog-to-digital converter (ADC) 518. In this example, DPD digital training signal ($X_{ref}$) 510 is input to a shaping processing circuit 520 that performs shaping operation on the DPD digital training signal ($X_{ref}$) 510. A shaped representation of the DPD digital training signal 525 is output from the shaping processing circuit 520.

In accordance with the first example of envelope shaping a signal by DPD calibration, the down-converted baseband portion of the output signal ($X_{PA}$) 326 is compared to the shaped representation of the DPD digital training signal 525 in a comparison circuit 530.

A calibration circuit (e.g. calibration processing engine) 540 determines how the transmitter circuitry, and particularly the power amplifier 324, has affected the DPD digital training signal ($X_{ref}$) 510, including the influence of the shaping, by analyzing the output from the comparison circuit 535 and determining PA nonlinearity (amplitude modulated to amplitude modulated (AM-to-AM) and amplitude modulated to phase modulated (AM-to-PM)) effects. The calibration circuit 540 then adapts phase and gain components in the DPD compensation circuit 515 that, effectively, pre-distorts the input signal, e.g. DPD digital training signal ($X_{ref}$) 510, to compensate for the subsequent non-linearity and distortion effects that will be caused to the input signal by the transmitter circuit and shape the envelope at the same time. In this manner, a desired envelope-shaped transmitter signal is output from the power amplifier, with the inherent non-linearity effects that would have been created cancelled out by the DPD applied by the compensation circuit 515.

In this example, $3^{rd}$ order polynomial shaping in a DPD calibration process is used, which is particularly useful for controlling the spectral regrowth of the transmit signal and reduce higher order nonlinearity to meet a WiFi™ spectral mask. In this example, the polynomial shaping processing circuit 520 includes a processor 575 configured to apply the $3^{rd}$ order polynomial shaping function in equation [6] to the DPD digital training signal ($X_{ref}$) 510, which is then multiplied to the DPD digital training signal ($X_{ref}$) 510 in multiplier 555.

$$f_{TX}(x) = 1 - a|x|^2 \qquad [6]$$

It is envisaged that in other examples that the shaping function can be applied to any higher order of polynomial shaping function, as illustrated in equation [7]:

$$f_{TX}(x) = 1 - \sum_n a_n |x|^{n-1} \qquad [7]$$

where $a_n$ is constant.

In other examples, the concept may be applied to any other transmitter architecture, where spectral regrowth is a concern, and is not limited to DPD calibration/compensation in order to support any shaping, including polynomial shaping.

Figure 6:
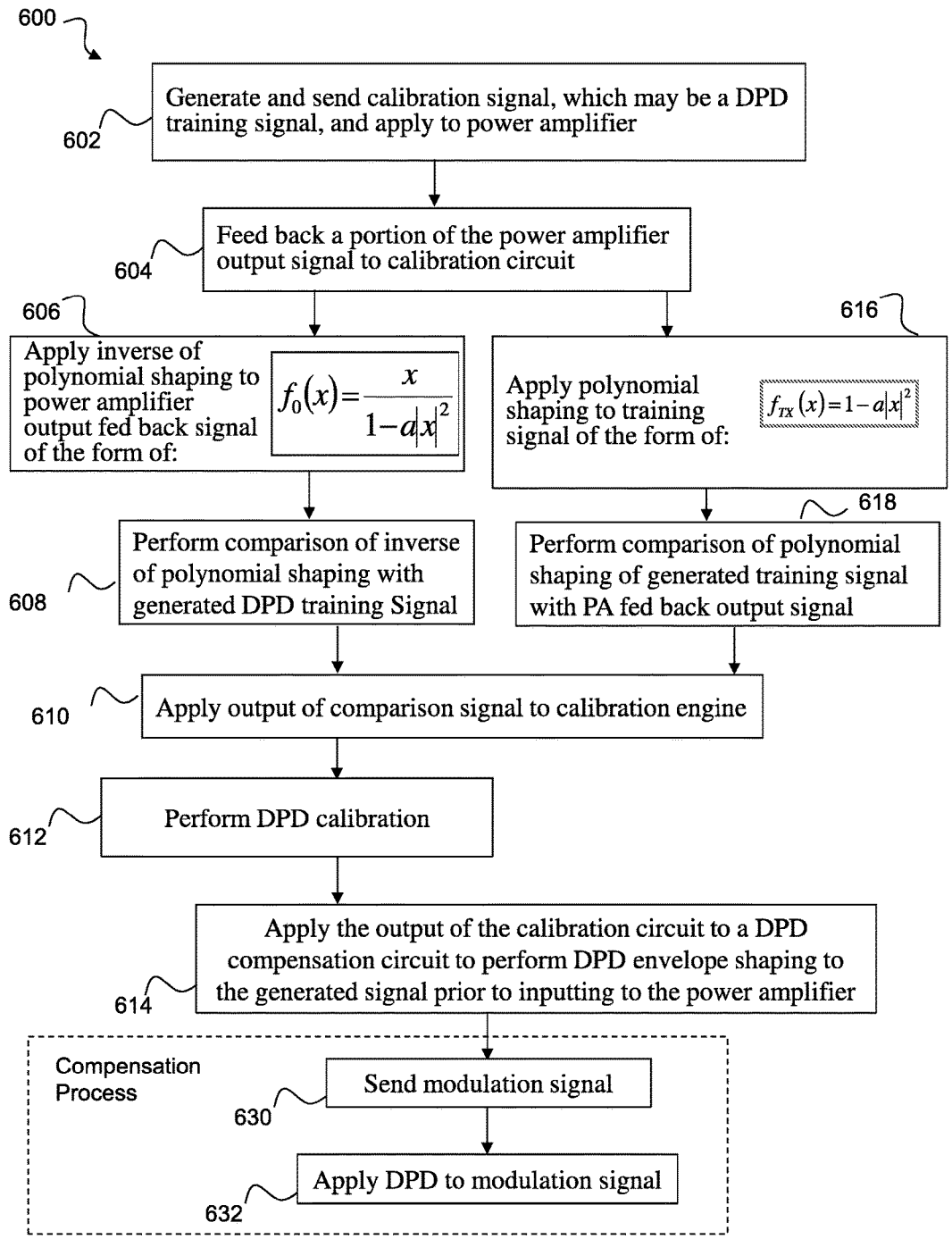
FIG. 6 illustrates an example flowchart of an envelope shaping by digital pre-distortion (DPD) calibration in accordance with some examples of the invention.

FIG. 6 illustrates an example flowchart 600 of an envelope shaping by digital pre-distortion (DPD) calibration in accordance with some examples of the invention. In this example, a calibration signal is generated and provided to the transmitter at 602, which may be a DPD digital training signal ($X_{ref}$). The calibration signal is routed through the transmitter circuit, converted to analog form in an optional digital-to-analog converter (DAC) and particularly routed through a power amplifier, such that the output signal ($X_{PA}$) is an amplified analog representation of the DPD digital training signal ($X_{ref}$). A portion of the output signal ($X_{PA}$) is routed back to the DPD circuit in 604, down-converted (not shown) and converted back to digital form.

In accordance with a first example of envelope shaping a signal by DPD calibration, the down-converted baseband portion of the output signal ($X_{PA}$) is input to an inverse shaping processing circuit that performs an inverse of the shaping operation on the down-converted baseband portion of the output signal ($X_{PA}$) at 606, in accordance with equation [1]. The DPD digital training signal is subsequently compared to the inverse shaped representation of fed back signal from the power amplifier at 608, the comparison of which is input to a calibration circuit at 610. A calibration circuit determines how the transmitter circuitry, and particularly the power amplifier, has affected the DPD digital training signal ($X_{ref}$), including the influence of the shaping, by analyzing the output from the comparison circuit at 612.

The calibration circuit then adapts phase and gain components in the DPD compensation circuit that, effectively, pre-distorts the input signal, e.g. DPD digital training signal ($X_{ref}$), to compensate for the subsequent non-linearity and distortion effects that will be caused to the input signal by the transmitter circuit at 614 and shape envelope at same time. In this manner, a desired shaped transmitter signal is output from the power amplifier, with the inherent non-linearity effects that would have been created cancelled out and shaped envelope as desired at the same time by the DPD applied by the compensation circuit.

In accordance with a second example of envelope shaping a signal by DPD calibration in the flowchart of FIG. 6, following 604, the DPD digital training signal ($X_{ref}$) is input to a shaping processing circuit that performs a shaping operation on the DPD digital training signal ($X_{ref}$) at 616, in accordance with equation [6]. A shaped representation of the DPD digital training signal is subsequently compared to the fed back signal from the power amplifier at 618, the comparison of which is input to a calibration circuit at 610. A calibration circuit determines how the transmitter circuitry, and particularly the power amplifier, has affected the DPD digital training signal ($X_{ref}$), by analyzing the output from the comparison circuit at 612. The calibration circuit then adapts phase and gain components in the DPD compensation circuit that, effectively, pre-distorts the input signal, e.g. DPD digital training signal ($X_{ref}$), to compensate for the subsequent non-linearity and distortion effects that will be caused to the input signal by the transmitter circuit at 614 and shape the envelope as desired at the same time.

Thereafter, a compensation process is employed. In the compensation process, a modulation signal is sent at 630 and the determined DPD values, for example as potentially stored in a DPD LUT with the DPD values modified using shaping (in 616) or inverse shaping (in 606), are then applied to the modulation signal 632.

In this manner, an envelope shaped transmitter signal is output from the power amplifier, with the inherent non-linearity effects that would have been created cancelled out by the DPD applied by the compensation circuit.

In this example, the shaping processing circuit and/or inverse shaping processing circuit may be configured to apply $3^{rd}$ order inverse polynomial shaping in a DPD calibration process, which is particularly useful for controlling the spectral regrowth of the transmit signal to meet a WiFi™ spectral mask.

The example illustrated in FIG. 6 applies to a $3^{rd}$ order polynomial shaping function, although in other examples it is envisaged that the shaping function $f_0(x)$ and $f_1(x)$ can be applied to any other order of polynomial.

Figure 7:
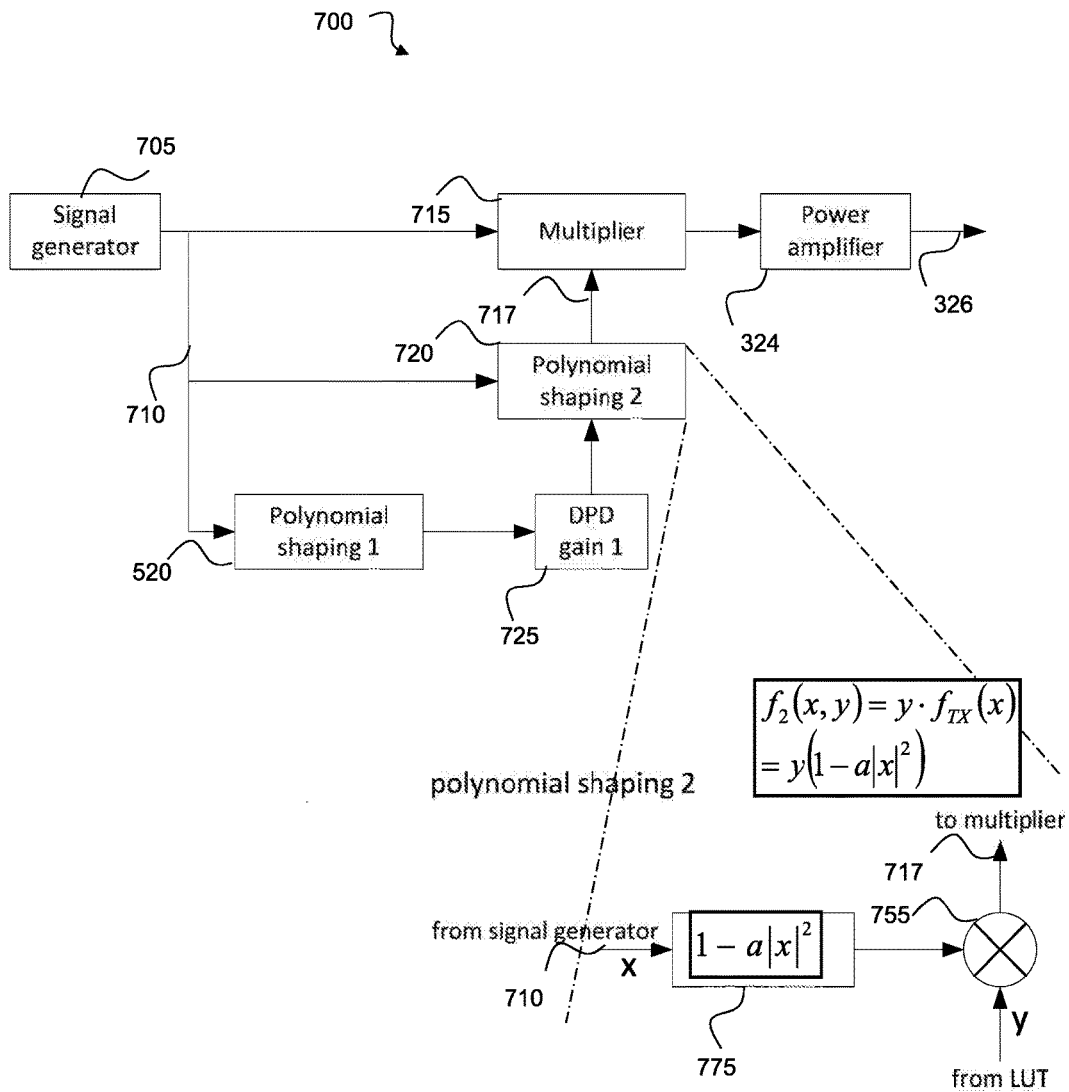
FIG. 7 illustrates a first example block diagram of an envelope shaping by digital pre-distortion (DPD) compensation arrangement in accordance with some examples of the invention.

Referring now to FIG. 7, a first example block diagram 700 of an envelope shaping by digital pre-distortion (DPD) compensation arrangement is illustrated, in accordance with some examples of the invention. In this example, a signal generator 705 generates a modulation signal 710, which is routed through the transmitter circuit, converted to analog form in an optional digital-to-analog converter (DAC) (not shown) and particularly routed through a power amplifier 324, such that the output signal ($X_{PA}$) 326 is an amplified analog representation of the modulation signal 710. The example illustrated in FIG. 7 applies to a $3^{rd}$ order polynomial shaping function, although in other examples it is envisaged that the shaping function can be applied to any other order of polynomial.

In this example, modulation signal 710 is input to a first polynomial shaping processing circuit 520 that performs first shaping operation on the modulation signal 710. A shaped representation of the modulation signal is output from the first shaping processing circuit 520 to a first DPD gain circuit 725, which is configured to calculate the AM (gain) compensation coefficients and/or PM compensation coefficients.

In accordance with this first example of envelope shaping a signal by DPD compensation, the gain-adjusted shaped representation of the modulation signal and the modulation signal itself are input to a second shaping processing circuit 720 that performs a second shaping operation. The second shaping processing circuit 720 performs a second shaping operation on the gain-adjusted shaped representation of the modulation signal and outputs a second gain-adjusted shaped representation of the modulation signal 717, in accordance with fTX(x) of equation [1] and [6] to a multiplier 715. The multiplier 715 is configured to multiply the modulation signal with the second gain-adjusted shaped representation of the modulation signal 717 to produce a signal to the power amplifier 324 that results in a lower spectral regrowth power amplifier output 326. In this manner, an envelope shaped transmitter signal is output from the power amplifier 324, with the inherent non-linearity effects that would have been created cancelled out.

In this polynomial-shaping example, the second shaping processing circuit 720 is configured to apply $3^{rd}$ order polynomial shaping in a DPD compensation process, which is particularly useful for controlling the spectral regrowth of the transmit signal to meet a WiFi™ spectral mask. In this example, the second shaping processing circuit 720 includes a processor 775 configured to apply the polynomial shaping function, for example $f_{TX}$ of a 3rd order polynomial in equation [6], to the modulation signal 710, which is then multiplied to the signal from the gain calculation circuit 725, which is configured to calculate the AM (gain) compensation coefficients, in multiplier 755.

In some examples, $3^{rd}$ order polynomial shaping is applied in a DPD compensation arrangement. In some examples, the gain calculation circuit 725 may be a DPD look up table (LUT) input. In some alternative examples, the DPD compensation may be a polynomial DPD instead of a gain-adjusted signal or a LUT DPD. Here, discrete AM-AM and AM-PM compensation data is stored in the DPD LUT and compensation coefficients are calculated by interpolation by the discrete DPD LUT. In the meantime, polynomial coefficients are stored in the memory in the case of polynomial DPD and compensation coefficients are calculated by a polynomial calculation. Two shaping blocks are required mathematically due to PA nonlinearity.

Figure 8:
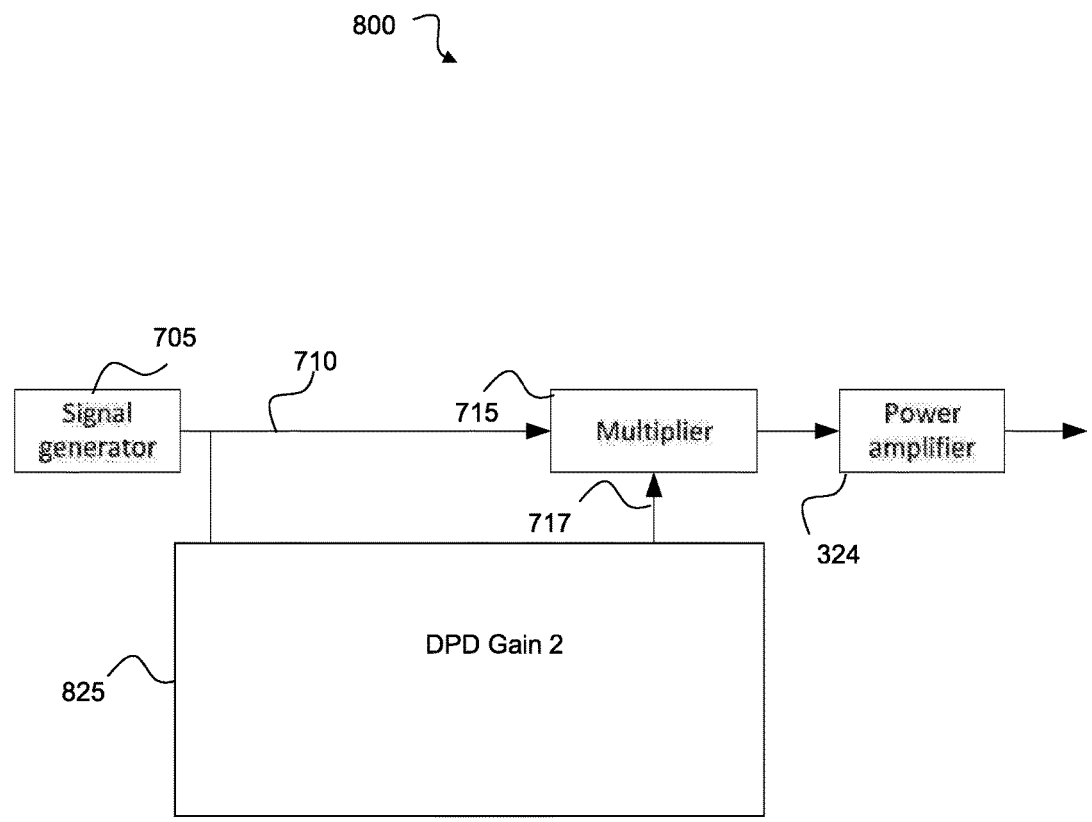
FIG. 8 illustrates a second example block diagram of an envelope shaping by digital pre-distortion (DPD) compensation arrangement in accordance with some examples of the invention.

Referring now to FIG. 8, a second example block diagram 800 of an envelope shaping by digital pre-distortion (DPD) compensation arrangement is illustrated, in accordance with some examples of the invention. This second example block diagram 800 of an envelope shaping by digital pre-distortion (DPD) compensation arrangement employs a similar strategy to the first compensation arrangement in FIG. 7, with the first shaping processing circuit 520, first gain calculation circuit 725 and second shaping processing circuit 720 replaced by a second DPD gain circuit 825. The example illustrated in FIG. 8 applies to a $3^{rd}$ order polynomial shaping function, although in other examples it is envisaged that the shaping function can be applied to any other order of polynomial. In this manner, the transfer function of the two shaping operations, 520, 720 and the first gain calculation circuit 725 in FIG. 7 may be pre-calculated and stored as a second DPD gain in DPD LUT. In this example, there is no real-time implementation of shaping, as this has been pre-calculated and may be implemented with appropriate second DPD gain values from a DPD LUT. Consequently, a reduction in hardware (or firmware) may be achieved in the circuit of FIG. 8 compared to the circuit of FIG. 7.

Figure 9:
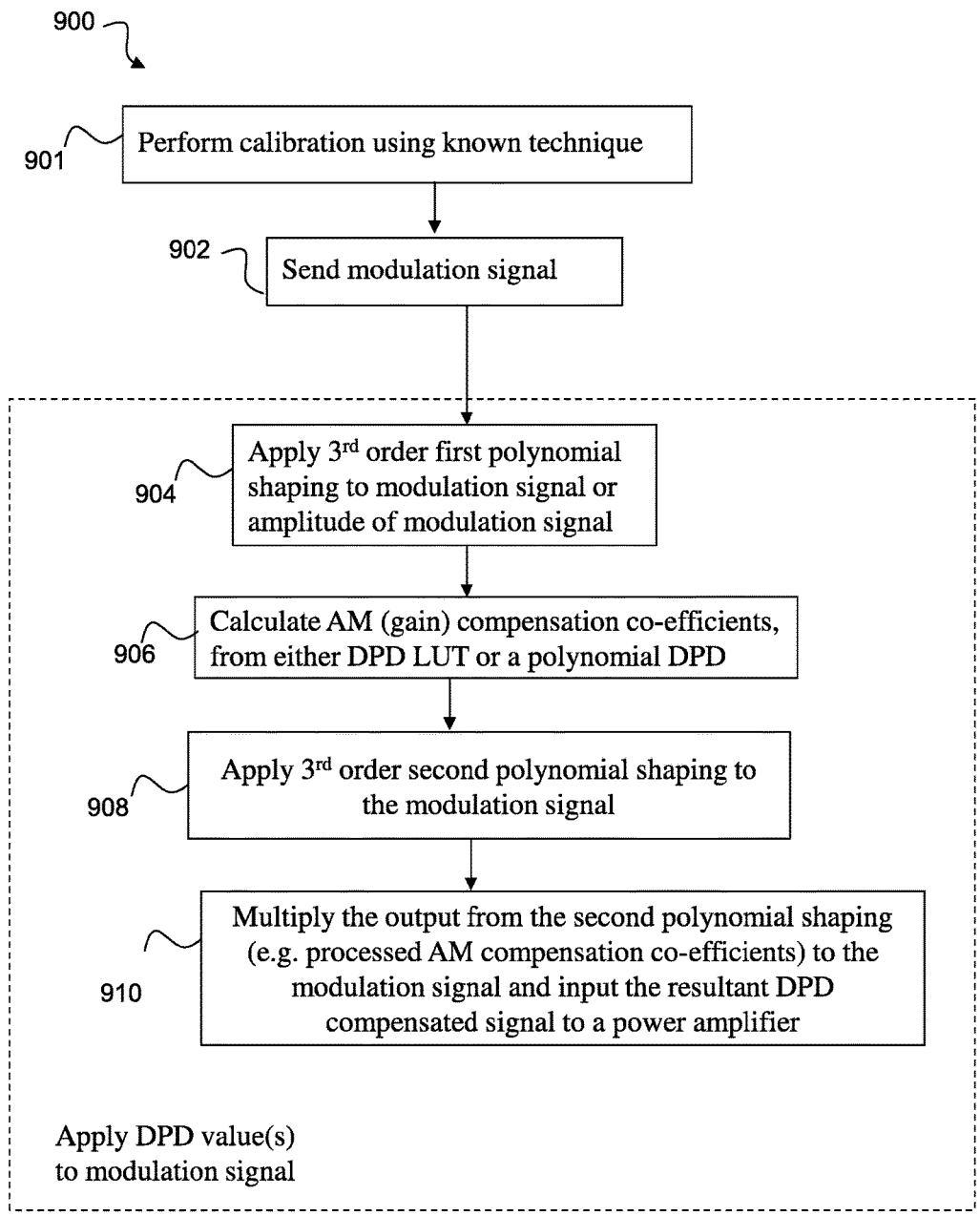
FIG. 9 illustrates a first example flowchart of an envelope shaping by digital pre-distortion (DPD) compensation in accordance with some examples of the invention.

Referring now to FIG. 9, a first example flowchart 900 of an envelope shaping by digital pre-distortion (DPD) compensation is illustrated, in accordance with some examples of the invention. In this example, at 901, a calibration process is performed, which may use known DPD calibration techniques. Performing an inverse of polynomial shaping is not needed in this case. A calibration process may include sending a calibration signal to the transmitter, applying a DPD adjustment to the calibration signal and comparing a feedback signal from a transmitter power amplifier with a reference signal, e.g. the input calibration signal, and updating the DPD values, say in a DPD LUT, accordingly. This calibration process may be performed one or multiple times, for example to fine-tune the DPD values.

A compensation process may then be implemented, with a modulation signal generated and sent at 902, which is routed through the transmitter circuit, converted to analog form in an optional digital-to-analog converter (DAC) and particularly routed through a power amplifier. At 904, a first shaping, for example a $3^{rd}$ order first polynomial shaping, is applied to the modulation signal or amplitude modulation part of the modulation signal. At 906, the AM (gain) compensation coefficients is/are calculated from either DPD LUT or a polynomial DPD. At 908, a $3^{rd}$ order second polynomial shaping signal is applied to the modulation signal. At 910, the output from the second polynomial shaping (e.g. processed AM compensation coefficients) is multiplied with the modulation signal and then the resultant DPD compensated signal is input to a power amplifier. In this manner, the flowchart operates in a similar manner to the circuit in FIG. 7.

Figure 10:
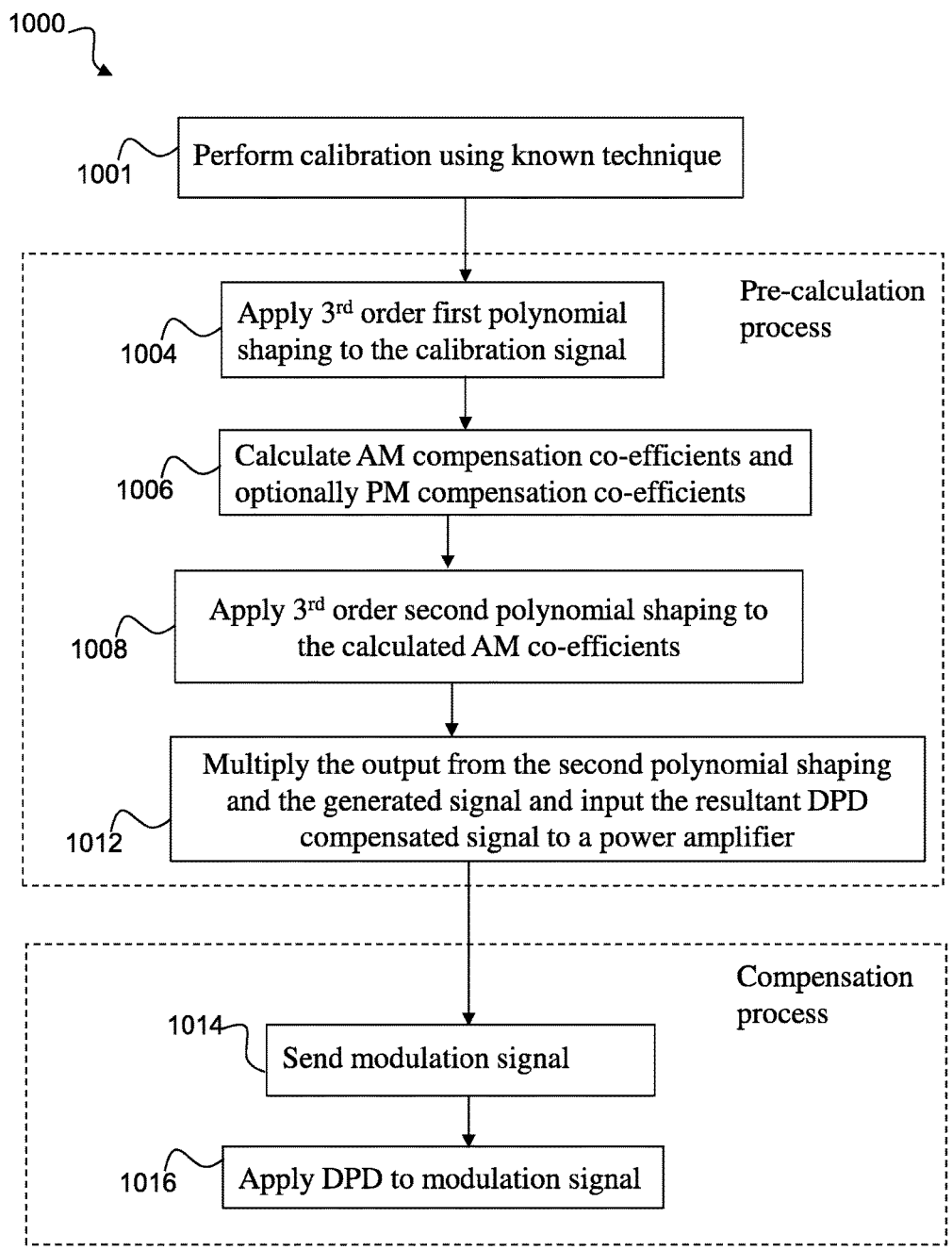
FIG. 10 illustrates a second example flowchart of an envelope shaping by digital pre-distortion (DPD) compensation, in accordance with some examples of the invention.

Alternatively, in a similar manner to the circuit in FIG. 8, a pre-calculated DPD gain compensation may be applied to the modulation signal. This is illustrated in the example flowchart 1000 of FIG. 10. In this example, at 1001, a calibration process is performed, which may use known techniques. Performing an inverse of polynomial shaping is not needed in this case. A calibration process may include sending a calibration signal to the transmitter, applying a DPD adjustment to the calibration signal and comparing a feedback signal from a transmitter power amplifier with a reference signal, e.g. the input calibration signal, and updating the DPD values, say in a DPD LUT, accordingly. This calibration process may be performed one or multiple times, for example to fine-tune the DPD values.

In this example, a pre-calculation process is then performed with the pre-calculated DPD gain compensation being equivalent to a combination of the two polynomial shaping operations, 520, 720 and the calculation of the AM (gain) compensation coefficients circuit 725 in FIG. 7. In this example, $3^{rd}$ order first polynomial shaping is applied to a second calibration signal at 1004. In some examples, the second calibration signal at 1004 may be a discrete level that corresponds to the DPD LUT value. At 1006, AM compensation coefficients, and optionally PM compensation coefficients, are calculated. At 1008, $3^{rd}$ order second polynomial shaping is applied to the calculated AM coefficients.

A compensation process may then be implemented, with a modulation signal generated at 1014 and the pre-calculated DPD value(s) applied at 1016 before being routed through the transmitter circuit, converted to analog form in an optional digital-to-analog converter (DAC) and particularly routed through a power amplifier. The example illustrated in 1014 of FIG. 10 applies to a $3^{rd}$ order polynomial shaping function, although in other examples it is envisaged that the shaping function can be applied to any other order of polynomial.

In some example embodiments, the examples herein described may increase transmitter output power for low order modulation signals, due to the lower spectral regrowth, so long as the output power meets the spectrum mask specification.

In some examples, for example in a WiFi™ system, the examples herein described may enhance communication coverage, for example where the communication standard does not specify the maximum output power. Such communication standards may employ low modulation coding schemes (MCS), such that examples herein described may improve the spectral mask.

In some examples, a conventional DPD calibration plus shaped compensation technique may not require an additional DPD LUT for shaping, which provides an implementation benefit compared with an insertion of shaping block in calibration step.

In a DPD calibration sense, two DPD calibration processes may be executed in order to support adaptive modulation, such as binary phase shift keyed (BPSK) and 256-level quadrature amplitude modulation (QAM). The first calibration process may include the conventional calibration and compensation arrangement of FIG. 2, which supports higher order modulation transmissions (e.g. 256QAM transmissions), whereby the DPD LUT 1 provides good EVM. In contrast, the second calibration process may be the envelope shaping DPD calibration techniques of FIGS. 4-6. In this manner, the DPD calibration better supports a low order modulation (such as BPSK) where the EVM requirement is much more relaxed and a high linearity is (typically) not required and the DPD LUT 2 provides a low spectrum regrowth.

In a 'DPD compensation' sense, where a conventional calibration is executed and the known compensation approach of FIG. 2 is used to support high order modulation (256QAM), a DPD LUT may be configured to provide good EVM. In contrast, in accordance with some examples, the novel $3^{rd}$ order polynomial envelope shaping DPD compensation techniques of FIGS. 7-9 may better support a low order modulation (such as BPSK), Furthermore, the DPD LUT plus envelope shaping provides a low spectrum regrowth. Advantageously, no additional DPD calibration time is required and no additional LUT (e.g. saving die space) is needed in this embodiment.

In the foregoing specification, the invention has been described with reference to specific examples of embodiments of the invention. It will, however, be evident that various modifications and changes may be made therein without departing from the scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

However, other modifications, variations and alternatives are also possible. The specifications and drawings are, accordingly, to be regarded in an illustrative rather than in a restrictive sense.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

For example, in some example embodiments, it is envisaged that a single processor may be configured to perform multiple functions and operations of circuits hereinbefore described. Furthermore, in some example embodiments, although the LUTs (e.g. storing first and second DPD gains) have been described individually, thereby suggesting that they may comprise separate memory elements, it is envisaged that a number or each may form a portion of a single LUT or memory element.

Also for example, the various components/modules, or portions thereof, may implemented as soft or code representations of physical circuitry or of logical representations convertible into physical circuitry, such as in a hardware description language of any appropriate type. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The connections as discussed herein may be any type of connections suitable to transfer signals from or to the respective nodes, units or devices, for example via intermediary components. Accordingly, unless implied or stated otherwise, the connections may for example be direct connections or indirect connections. The connections may be illustrated or described in reference to being a single connection, a plurality of connections, unidirectional connections or bidirectional connections. However, different illustrated examples may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

It will be appreciated that, for clarity purposes, the above description has described embodiments of the invention with reference to different functional units and processors. However, it will be apparent that any suitable distribution of functionality between different functional units or processors, for example one or more shaping circuits, etc., may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, lower spectral regrowth solutions have been described, wherein the aforementioned disadvantages with prior art arrangements have been substantially alleviated.

We claim:

1. A transmitter comprising:
a signal generator arranged to generate a digital baseband signal representative of a signal for transmission;
a digital predistortion, DPD, circuit configured to predistort the digital baseband signal;
a power amplifier arranged to amplify the predistorted signal; and
a signal adjustment circuit operably coupled to the signal generator and the DPD circuit and configured to receive the generated signal and apply polynomial shaping to the digital baseband signal input to the DPD circuit for generating adjustment for the predistortion applied to at least an amplitude of the generated signal.

2. The transmitter of claim 1 further comprising a processor coupled to the signal adjustment circuit and configured to determine the polynomial shaping ($f_{TX}(x)$) to be applied wherein the signal adjustment circuit applies the polynomial shaping to the digital baseband signal input to the DPD circuit to predistort the amplitude of the generated signal in a calibration process.

3. The transmitter of claim 2 wherein the polynomial shaping ($f_{TX}(x)$) applied by the signal adjustment circuit is a function of $|x|$ and corresponds to envelope control of the signal for transmission.

4. The transmitter of claim 2 wherein the polynomial shaping is inverse polynomial shaping applied to a power amplified signal in a feedback path from the power amplifier.

5. The transmitter of claim 4 wherein applying an inverse polynomial comprises applying multiplication substantially of a form of: $1/(1-a|x|^2)$.

6. The transmitter of claim 2 wherein an input digital signal to the DPD circuit in a calibration process is an input digital linearization training signal.

7. The transmitter of claim 2 wherein the determined polynomial shaping comprises DPD values that are stored by the signal adjustment circuit.

8. The transmitter of claim 1 wherein the polynomial shaping is determined and applied to the DPD circuit to predistort an envelope of the generated signal in a compensation process.

9. The transmitter of claim 8 wherein the polynomial shaping is applied to a portion of an input digital signal that is also provided to the DPD circuit, wherein the polynomial shaping of the input digital signal is used to adjust the predistortion applied to the amplitude of the generated input digital signal.

10. The transmitter of claim 8 wherein the polynomial shaping comprises applying multiplication substantially of a form of: $f_{TX}(x) = 1 - \Sigma_n a_n |n|^{n-1}$; wherein $a_n$ is a coefficient and n is an even integer.

11. The transmitter of claim 10 wherein the polynomial shaping determined and applied to the DPD circuit comprises applying a first polynomial shaping to the input digital signal in a DPD compensation path, applying the polynomial shaped input digital signal to a DPD gain circuit to predistort the polynomial shaped input digital signal and applying the predistorted polynomial shaped input digital signal to a second polynomial shaping circuit.

12. The transmitter of claim 11 wherein the second polynomial shaping circuit applies polynomial shaping substantially of a form of: $f_2(x,y) = y^* f_{TX}(x)$, where $f_{TX}(x) = 1 - a^*|x|^2$.

13. The transmitter of claim 11 wherein the DPD gain circuit is configured to provide a DPD component adjustment input signal to the DPD circuit.

14. The transmitter of claim 1 wherein the signal adjustment circuit is further configured to apply only amplitude modulation, AM, control with polynomial shaping to the generated signal in addition to the DPD circuit being configured to applying AM control and phase modulation, PM, control.

15. The transmitter of claim 14 further comprising a look-up table, LUT, coupled to the DPD circuit comprises DPD data that is adapted to account for PM effects due to the signal adjustment circuit applying amplitude modulation, AM, control of the generated signal with polynomial shaping.

16. A communication unit comprises a transmitter comprising:
a signal generator arranged to generate a digital baseband signal representative of a signal for transmission;

a digital predistortion, DPD, circuit configured to predistort the digital baseband signal;

a power amplifier arranged to amplify the predistorted signal; and a signal adjustment circuit operably coupled to the signal generator and the DPD circuit and configured to receive the generated signal and apply polynomial shaping to the digital baseband signal input to the DPD circuit for generating adjustment for the predistortion applied to at least an amplitude of the generated signal.

17. The communication unit of claim 16 further comprising a processor coupled to the signal adjustment circuit and configured to determine the polynomial shaping ($f_{TX}(x)$) to be applied wherein the signal adjustment circuit applies polynomial shaping to the DPD circuit to predistort the amplitude of the generated signal in a calibration process.

18. The communication unit of claim 17 wherein the polynomial shaping ($f_{TX}(x)$) applied by the signal adjustment circuit is a function of |x| and corresponds to envelope control of the signal for transmission.

19. The communication unit of claim 17 wherein the polynomial shaping is inverse polynomial shaping applied to a power amplified signal in a feedback path from the power amplifier.

20. A method for limiting spectral re-growth within a transmitter, the method comprising:

generating a digital baseband signal representative of a signal for transmission;

applying polynomial shaping to the digital signal representative of a signal for transmission or an amplified version of the predistorted signal input to a digital predistortion, DPD, circuit;

predistorting the digital baseband signal by the DPD circuit;

amplifying the predistorted signal; and adjusting the DPD circuit based on polynomial shaping, such that predistortion applied to at least an amplitude of a generated signal controls spectral re-growth.

* * * * *